(12) United States Patent
Radwan

(10) Patent No.: US 12,732,140 B2
(45) Date of Patent: Sep. 8, 2026

(54) POWER AMPLIFIER WITH PROGRAMMABLE BANDWIDTH

(71) Applicant: Apple Inc., Cupertino, CA (US)

(72) Inventor: Ahmed G Radwan, Munich (DE)

(73) Assignee: Apple Inc., Cupertino, CA (US)

( * ) Notice: Subject to any disclaimer, the term of this patent is extended or adjusted under 35 U.S.C. 154(b) by 461 days.

(21) Appl. No.: 18/218,478

(22) Filed: Jul. 5, 2023

(65) Prior Publication Data

US 2025/0015767 A1 Jan. 9, 2025

(51) Int. Cl.

*H03F 9/00* (2006.01)
*H03F 1/56* (2006.01)
*H03F 3/24* (2006.01)
*H04B 1/04* (2006.01)

(52) U.S. Cl.

CPC ............ *H03F 1/565* (2013.01); *H03F 3/245* (2013.01); *H04B 1/0458* (2013.01); *H03F 2200/391* (2013.01); *H04B 2001/0408* (2013.01)

(58) Field of Classification Search

CPC ........................................................ H03F 9/00
USPC ................................................ 330/276, 165
See application file for complete search history.

(56) References Cited

U.S. PATENT DOCUMENTS 6,831,818 B2 * 12/2004 Dickhoff .................. G05F 1/12 361/18
8,335,542 B2 * 12/2012 Hamparian .......... H04B 1/0483 455/562.1
8,912,639 B2 12/2014 Rofougaran
9,306,502 B2 * 4/2016 Chan .................... H03F 1/0277
10,284,166 B2 5/2019 Sira
10,491,026 B2 11/2019 Komulainen et al.
10,574,287 B1 2/2020 Egambaram et al.
10,897,236 B2 1/2021 Yu et al.
11,108,372 B2 * 8/2021 Mao .................... H04B 1/0057
11,159,191 B1 10/2021 Mohammadnezhad et al.
11,595,075 B2 2/2023 Mohammadnezhad et al.
12,003,221 B2 * 6/2024 Cao .......................... H03F 3/72
2009/0153260 A1 6/2009 Rofougaran
2022/0263479 A1 8/2022 Park et al.

* cited by examiner

*Primary Examiner* — Henry Choe
(74) *Attorney, Agent, or Firm* — FLETCHER YODER PC

(57) ABSTRACT

This disclosure is directed to a power amplifier including a programmable impedance matching circuit. The programmable impedance matching circuit may include a programmable primary inductor and a secondary inductor. The programmable primary inductor may adjust a center frequency (e.g., resonant frequency) for providing amplified signals by the power amplifier to improve (e.g., expand) a frequency bandwidth of the power amplifier. As such, the power amplifier may have improved frequency bandwidth compared to other power amplifiers.

20 Claims, 5 Drawing Sheets

POWER AMPLIFIER WITH PROGRAMMABLE BANDWIDTH

BACKGROUND

The present disclosure relates generally to power amplifiers of an electronic device. In particular, the present disclosure relates to capacitive power amplifiers generating output analog signals based on receiving outgoing data.

An electronic device may include multiple power amplifiers. For example, a bandwidth of each power amplifier may correspond to a portion of a bandwidth of the electronic device. A power amplifier may include a primary inductor and a secondary inductor. In operation, the primary inductor and the secondary inductor may inductively couple to generate the output signals in a frequency bandwidth. In some cases, the power amplifier may generate the output signals with reduced bandwidth. As such, the bandwidth of the power amplifier may correspond to a smaller portion of a bandwidth of the electronic device. Accordingly, the electronic device may include an increased number of power amplifiers occupying an increased area for generating the output signals across the bandwidth of the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a power amplifier may include a first branch including a first capacitor, a second branch including a second capacitor, and an impedance matching circuit. The impedance matching circuit may include a programmable primary inductor circuit coupled to the first branch and the second branch including a fixed inductor, a switching circuit including multiple switches coupled to the fixed inductor, and a switchable inductor coupled to the switching circuit. The impedance matching circuit may include a secondary inductor.

In another embodiment, a power amplifier may include a first branch, a second branch, and an impedance matching circuit. The first branch and the second branch may generate an analog signal based on receiving outgoing data. The impedance matching circuit may generate an amplified signal based on the analog signal, and a secondary inductor that may output the amplified signal. The impedance matching circuit may include a programmable primary inductor circuit coupled to the first branch and the second branch that may receive the analog signal. The programmable primary inductor circuit may include a fixed inductor coupled to the first branch and the second branch, a switchable inductor, and a switching circuit that may couple the switchable inductor to the fixed inductor to generate current having a same direction as current of the fixed inductor, couple the switchable inductor to the fixed inductor to generate current having an opposite direction as current of the fixed inductor, and uncouple the switchable inductor from the fixed inductor.

In yet another embodiment, a method may include receiving, by a processor, an indication of a frequency of a signal, coupling, by the processor, a switchable inductor of a programmable primary inductor of an impedance matching circuit in parallel to a fixed inductor of the programmable primary inductor to generate a first current in the switchable inductor in an opposite direction as a second current of the fixed inductor in response to determining that the frequency is above a first threshold, wherein a power amplifier may include the matching circuit, coupling, by the processor, the switchable inductor to the fixed inductor to generate the first current in the switchable inductor in a same direction as the second current of the fixed inductor in response to determining that the frequency is above a second threshold, uncoupling, by the processor, the switchable inductor from the fixed inductor, and outputting, by the processor, the signal with the frequency to a power amplifier that may include the impedance matching circuit to generate an amplified signal based on the signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

When introducing elements of various embodiments of the present disclosure, the articles “a,” “an,” and “the” are intended to mean that there are one or more of the elements. The terms “comprising,” “including,” and “having” are intended to be inclusive and mean that there may be additional elements other than the listed elements. Additionally, it should be understood that references to “one embodiment” or “an embodiment” of the present disclosure are not intended to be interpreted as excluding the existence of additional embodiments that also incorporate the recited features. Furthermore, the particular features, structures, or characteristics may be combined in any suitable manner in one or more embodiments. Use of the terms “approximately,” “near,” “about,” “close to,” and/or “substantially” should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term “set” may include one or more. That is, a set may include a unitary set of one member, but the set may also include a set of multiple members.

This disclosure is directed to a power amplifier including a programmable impedance matching circuit. In some embodiments, the power amplifier may include a digital-to-analog converter (DAC) and/or a capacitive digital-to-analog converter (CDAC). The programmable impedance matching circuit may adjust a resonant frequency of the power amplifier for generating amplified signals. Adjusting the resonant frequency of the power amplifier may correspond to adjusting a frequency bandwidth of the power amplifier and/or a center frequency of the amplified signals. As such, the power amplifier may have improved (e.g., expanded) bandwidth compared to other power amplifiers.

In some embodiments, an electronic device (and/or a transmitter of the electronic device) may include one or more power amplifiers having the programmable impedance matching circuit. The bandwidth of each power amplifier may correspond to a larger portion of a bandwidth of the electronic device compared to other power amplifiers. Accordingly, the electronic device may include a reduced number of power amplifiers for generating the output signals across the bandwidth of the electronic device (and/or the transmitter of the electronic device).

Figure 1:
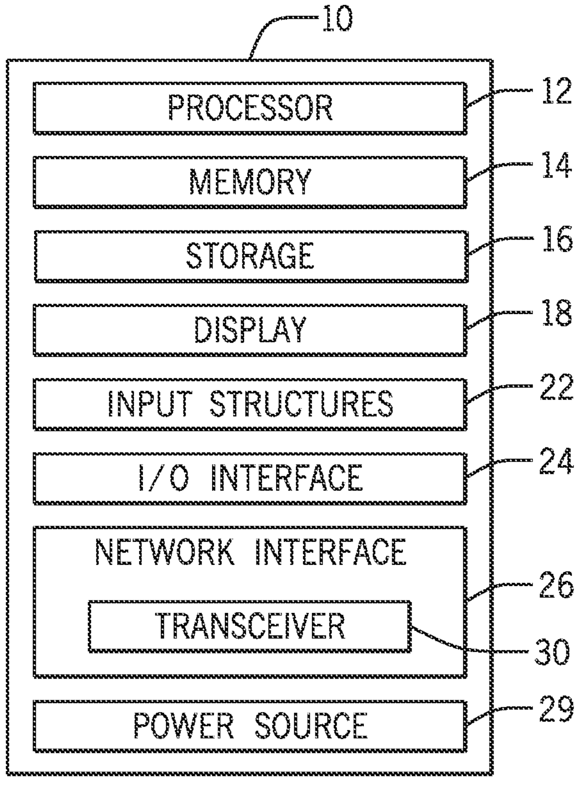
FIG. 1 is a block diagram of an electronic device, according to embodiments of the present disclosure.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
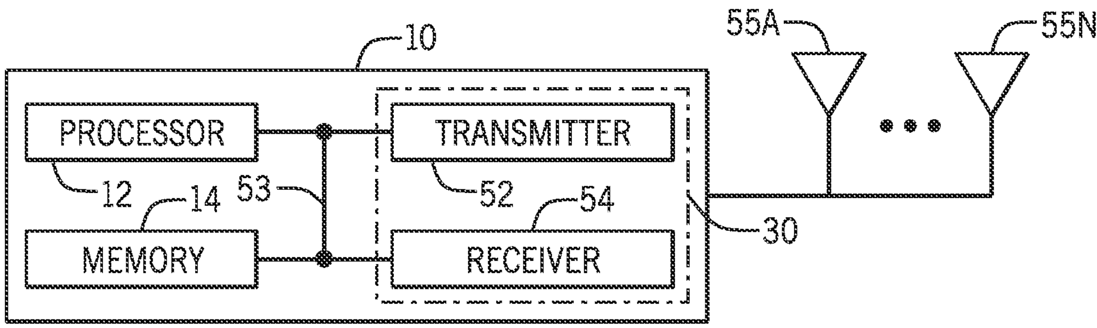
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55 or antennas 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 53. The bus system 53 may include a data bus, for example, as well as a power bus, a control signal bus, and a status signal bus, in addition to the data bus. The components of the electronic device 10 may be coupled together or accept or provide inputs to each other using some other mechanism.

Figure 3:
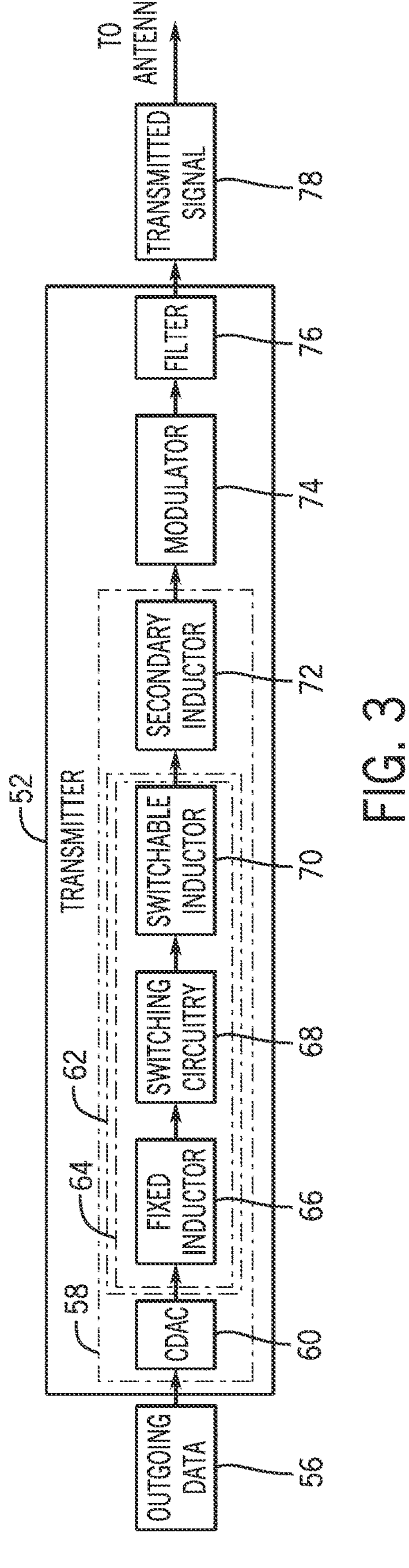
FIG. 3 is a schematic diagram of a transmitter of the electronic device of FIG. 1 including a power amplifier that includes a programmable impedance matching circuit, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 56 in the form of a digital signal to be transmitted via the antennas 55. In the embodiments described herein, a power amplifier (PA) 58 of the transmitter 52 may include a CDAC 60 and an impedance matching circuit 62 (e.g., a programmable impedance matching circuit) to generate amplified signals based on receiving the outgoing data 56. It should be appreciated that in alternative or additional embodiments, the power amplifier 58 may include any other viable circuit with the impedance matching circuit 62. For example, the power amplifier 58 may not include the CDAC 60 and/or may include a different digital-to-analog converter (DAC), among other things.

In the depicted embodiment, the CDAC 60 may generate analog signals based on receiving the outgoing data 56. The impedance matching circuit 62 may output the amplified signals with a desired frequency by matching (e.g., approximately matching) an output impedance of the power amplifier 58 to an input impedance of a subsequent circuit (e.g., a modulator 74). The impedance matching circuit 62 may include circuitry to adjust a resonant or center frequency of the amplified signals and/or a bandwidth of the power amplifier 58 for generating the amplified signals, as will be appreciated. For example, the resonant or center frequency of the amplified signals may correspond to a frequency of the amplified signals and/or a frequency around which amplified signals are concentrated (e.g., approximately concentrated). Moreover, the CDAC 60 and the impedance matching circuit 62 may amplify the analog signal to a suitable level to drive transmission of the signal via the antennas 55.

The impedance matching circuit 62 may include a programmable primary inductor 64 (e.g., a programmable primary inductor circuit) coupled to the CDAC 60 and a secondary inductor 72 coupled to an output terminal of the power amplifier 58. The programmable primary inductor 64 may include a fixed inductor 66, a switching circuit 68, and a switchable inductor 70. The fixed inductor 66 may be coupled to (e.g., fixed to) the CDAC 60, such that it may not be uncoupled from the CDAC 60. Accordingly, the fixed inductor 66 may provide a fixed or static inductance with respect to the CDAC 60. The switchable inductor 70 may be switchable to connect to or disconnect from the fixed inductor 66. Accordingly, the switchable inductor 70 may provide a variable inductance with respect to the CDAC 60.

In particular, the switching circuit 68 may couple (e.g., connect) and uncouple (e.g., disconnect) the switchable inductor 70 and the fixed inductor 66 to provide different inductances for generating the amplified signals having different frequencies within different bandwidth. As such, the fixed inductor 66 and/or the switchable inductor 70 may inductively or magnetically couple to the secondary inductor 72 during operation to generate the amplified signals. Accordingly, the switching circuit 68 may control a center frequency of the amplified signals and/or bandwidth of the power amplifier 58 for generating the amplified signals.

In some cases, the power amplifier 58 may output the amplified signals in a first bandwidth when the switching circuit 68 uncouples the switchable inductor 70 from the fixed inductor 66. As such, the fixed inductor 66 may inductively or magnetically couple to the secondary inductor 72 to generate the amplified signals. The first bandwidth may correspond to a first center frequency of the power amplifier 58 for generating the amplified signals. For example, the first bandwidth may have a first high (e.g., maximum) frequency threshold and a first low (e.g., minimum) frequency threshold.

The power amplifier 58 may generate the amplified signals in a second bandwidth when the switching circuit 68 couples the switchable inductor 70 to the fixed inductor 66 in parallel to generate current flow of the switchable inductor 70 in a same direction as current flow of the fixed inductor 66. The same direction of current flow of the switchable inductor 70 and the fixed inductor 66 may correspond to the switchable inductor 70 and the fixed inductor 66 conducting in-phase currents and/or generating magnetic field in a same direction (e.g., approximately same direction). As such, the switchable inductor 70 and the fixed inductor 66 may include wires wound in the same direction, though in additional or alternative embodiments, the switchable inductor 70 and the fixed inductor 66 may include wires wound in opposite directions.

As such, the fixed inductor 66 and the switchable inductor 70 may inductively or magnetically couple to the secondary inductor 72 to generate the amplified signals. Moreover, the switchable inductor 70 and the fixed inductor 66 may exhibit positive coupling when the switchable inductor 70 is coupled in parallel to the fixed inductor 66 to generate current flow in the same current flow direction. It should be understood that the switchable inductor 70 and the fixed inductor 66 are said to be positively coupled when the magnetic field generated by the switchable inductor 70 and the fixed inductor 66 induces the amplified signal in the secondary inductor 72 with a higher voltage compared to a magnetic field of either of the switchable inductor 70 and the fixed inductor 66.

Moreover, coupling the switchable inductor 70 in parallel to the fixed inductor 66 may reduce an impedance of the programmable primary inductor 64 and shift the center frequency higher than when the switchable inductor 70 is uncoupled from the fixed inductor 66. As such, a second center frequency of the second bandwidth may be higher than the first center frequency of the first bandwidth. As such, the second bandwidth may have a second high (e.g., maximum) frequency threshold higher than the first high frequency threshold and a second low (e.g., minimum) frequency threshold higher than the first low frequency threshold.

The power amplifier 58 may generate the amplified signals in a third bandwidth when the switching circuit 68 couples the switchable inductor 70 to the fixed inductor 66 in parallel to generate current flow in an opposite direction of current flow of the fixed inductor 66. The opposite direction of current flow of the switchable inductor 70 and the fixed inductor 66 may correspond to the switchable inductor 70 and the fixed inductor 66 conducting out-of-phase currents and/or generating magnetic field in opposite directions (e.g., approximately opposite directions).

In operation, the fixed inductor 66 and the switchable inductor 70 may inductively or magnetically couple to the secondary inductor 72 to generate the amplified signals. Moreover, the switchable inductor 70 and the fixed inductor 66 may exhibit negative coupling when the switchable inductor 70 is coupled in parallel to the fixed inductor 66 to generate current flow in the opposite current flow direction. It should be understood that the switchable inductor 70 and the fixed inductor 66 are said to be negatively coupled when the magnetic field generated by the switchable inductor 70 and the fixed inductor 66 induces the amplified signal with a lower voltage in the secondary inductor 72 compared to a magnetic field of either of the switchable inductor 70 and the fixed inductor 66.

As mentioned above, coupling the switchable inductor 70 in parallel to the fixed inductor 66 may reduce an impedance of the programmable primary inductor 64 and shift the center frequency higher. Moreover, negatively coupling the switchable inductor 70 and the fixed inductor 66 may shift a third center frequency of the third bandwidth higher than the second center frequency of the second bandwidth. As such, the third bandwidth may have a third high (e.g., maximum) frequency threshold higher than the second high frequency threshold and a third low (e.g., minimum) frequency threshold higher than the second low frequency threshold.

In some embodiments, an electronic device 10 and/or the transmitter 52 may include a number (e.g., one or more) of the power amplifiers 58 having the impedance matching circuit 62. In such embodiments, the bandwidth of each power amplifier 58 may correspond to a larger portion of a bandwidth of the electronic device 10 compared to other power amplifiers. For example, the bandwidth of each power amplifier 58 may include the first bandwidth, the second bandwidth, and the third bandwidth discussed above. Accordingly, the electronic device 10 may include a reduced number of power amplifiers 58 for generating the amplified signals across the bandwidth of the electronic device 10 and/or the transmitter 52 compared to other electronic devices including different power amplifiers.

In any case, the modulator 74 may combine the amplified signal with a carrier signal to generate a radio wave. A filter 76 (e.g., filter circuitry and/or software) of the transmitter 52 may then remove undesirable noise from the amplified signal (and/or amplified and modulated signal) to generate transmitted signal 78 to be transmitted via the antennas 55. The filter 76 may include any suitable filter or filters to remove the undesirable noise from the amplified signal, such as a bandpass filter, a bandstop filter, a low pass filter, a high pass filter, and/or a decimation filter.

The power amplifier 58, the modulator 74, and/or the filter 76 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 56 via the antennas 55. For example, the transmitter 52 may include a mixer and/or a digital up converter. As another example, the transmitter 52 may not include the filter 76 if the power amplifier 58 outputs the amplified signal in or approximately in a desired frequency range (such that filtering of the amplified signal may be unnecessary).

It should be appreciated that in some embodiments, the electronic device 10 may include multiple power amplifiers 58, multiple modulators 74, and/or multiple filters 76. In such embodiments, each of the power amplifiers 58, the modulators 74, and/or the filters 76 may couple to one or more of the antennas 55. In some embodiments, based on incorporating the power amplifiers 58, the electronic device 10 may include a reduced number of the power amplifiers 58, the modulators 74, and/or the filters 76 for generating the transmitted signal 78 across a bandwidth of the transmitter 52. Each of the programmable primary inductors 64 of the power amplifiers 58 may enable the power amplifiers 58 to operate over an increased bandwidth based on adjusting the center frequency of the impedance matching circuit 62 for generating the amplified signals. As such, a reduced number of power amplifiers 58 may be used in the transmitter 52, thus reducing circuit area in the electronic device 10.

Figure 4A:
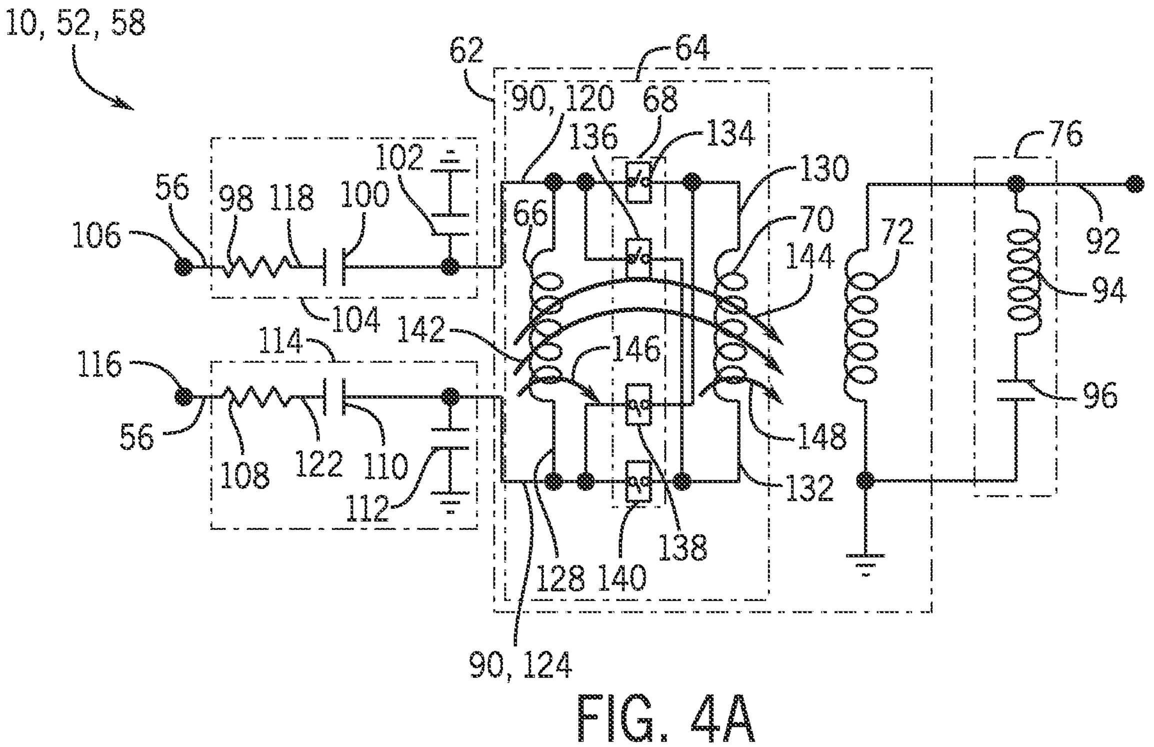
FIG. 4A is a circuit diagram of the power amplifier of the transmitter of FIG. 3 having a switchable inductor of the programmable impedance matching circuit coupled to a fixed inductor of the programmable impedance matching circuit to generate a current flow in a direction of current flow through the fixed inductor, according to embodiments of the present disclosure.

FIG. 4A is a circuit diagram of the power amplifier 58 including the impedance matching circuit 62 and the filter 76, according to embodiments of the present disclosure. It should be appreciated that in alternative or additional embodiments, the power amplifier 58 may include any other circuitry such as the CDAC 60 discussed above.

The power amplifier 58 may generate analog signals 90 based on receiving the outgoing data 56. The impedance matching circuit 62 of the power amplifier 58 may generate amplified signals 92 with improved (e.g., expanded) bandwidth compared to other power amplifiers based on receiving the analog signals 90. In some embodiments, the bandwidth of the power amplifier 58 may correspond to a larger portion of the bandwidth of the electronic device 10 compared to other power amplifiers. Accordingly, in some cases, the electronic device 10 may include a reduced number of power amplifiers 58 and/or transmitters 52 to generate the amplified signals 92 based on including the power amplifier 58. In such cases, a circuit area of each of the transmitter 52 and/or the electronic device 10 may be reduced.

In the depicted embodiment, the filter 76 (e.g., a notch filter, among other possibilities) may include an output inductor 94 and an output capacitor 96 to filter the amplified signals 92. For example, the filter 76 may reduce undesired portions of the amplified signals 92 having a frequency higher than a threshold, below a threshold, outside a high threshold and a low threshold, or inside a high threshold and a low threshold. It should be appreciated that in alternative or additional embodiments, the filter 76 may include any other viable components. Alternatively, in specific cases, the power amplifier 58 may not include the filter 76.

In any case, the power amplifier 58 may have a first branch 104 including a first resistor 98, a first capacitor 100, and a first shunt capacitor 102. The first resistor 98 may be coupled to a first input terminal 106 of the power amplifier 58. Moreover, the power amplifier 58 may have a second branch 114 including a second resistor 108, a second capacitor 110, and a second shunt capacitor 112. The second resistor 108 may be coupled to a second input terminal 116 of the power amplifier 58. The first input terminal 106 and the second input terminal 116 may couple to external circuitry (e.g., differential drivers) to receive the outgoing data 56. In some embodiments, the external circuitry may include the processor 12 of the electronic device 10 discussed above with respect to FIG. 1, or any other viable circuit.

The first capacitor 100 may couple to the first resistor 98 at a first node 118 and may couple to the first shunt capacitor 102 at a second node 120. Moreover, the second capacitor 110 may couple to the second resistor 108 at a third node 122 and may couple to the second shunt capacitor 112 at a fourth node 124. In the depicted embodiment, the first shunt capacitor 102 and the second shunt capacitor 112 are coupled to a ground connection. It should be appreciated that in alternative or additional embodiments, the first shunt capacitor 102 and the second shunt capacitor 112 may be virtually grounded. For example, the first shunt capacitor 102 may be coupled to the second shunt capacitor 112 to induce a virtual ground between the first shunt capacitor 102 and the second shunt capacitor 112.

The impedance matching circuit 62 may include the programmable primary inductor 64 and the secondary inductor 72. The programmable primary inductor 64 may include the fixed inductor 66 having a first terminal 126 and a second terminal 128, the switchable inductor 70 having a first terminal 130 and a second terminal 132, and the switching circuit 68. In the depicted embodiment, the switching circuit 68 may include a first switch 134, a second switch 136, a third switch 138, and a fourth switch 140. For example, the first switch 134, the second switch 136, the third switch 138, and the fourth switch 140 may each be double-pole or double-through switches to conduct current flow in two directions. It should be appreciated that in different embodiments, the switching circuit 68 may include different circuitry.

Figure 4B:
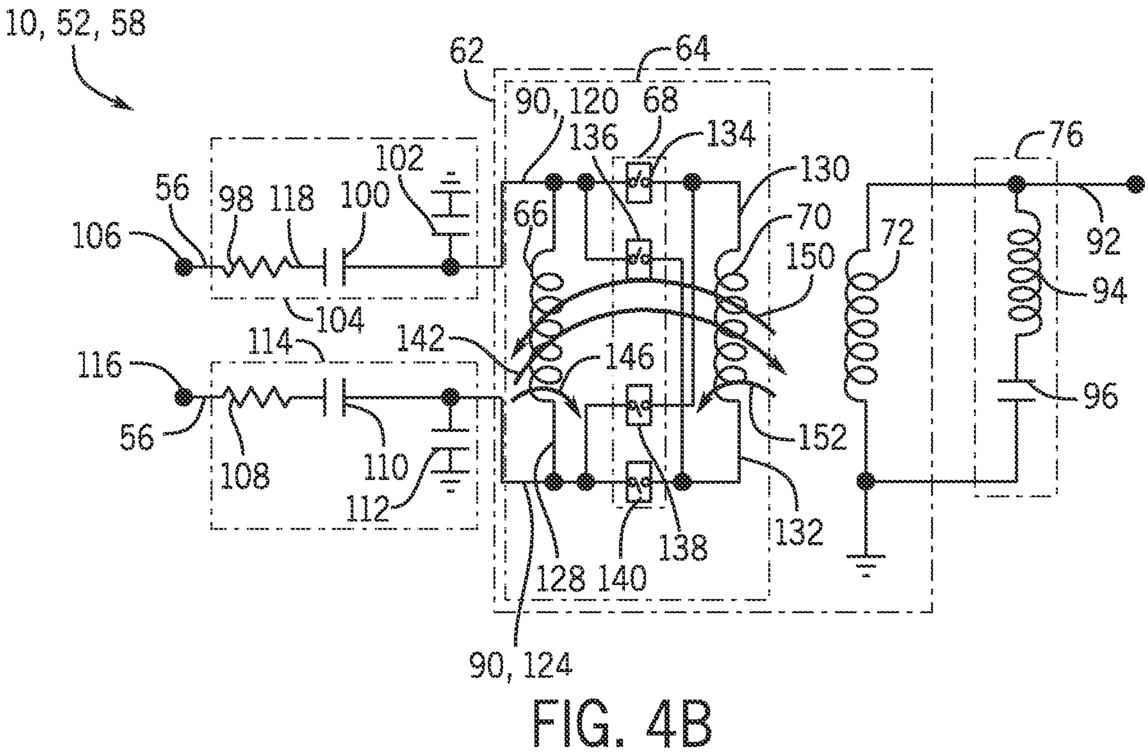
FIG. 4B is a circuit diagram of the power amplifier of the transmitter of FIG. 3 having the switchable inductor coupled to the fixed inductor to generate a current flow in an opposite direction of current flow through the fixed inductor, according to embodiments of the present disclosure.

In some cases, the switching circuit 68 may uncouple (e.g., disconnect) the switchable inductor 70 from the fixed inductor 66. In some other cases, the switching circuit 68 may couple (e.g., connect) the switchable inductor 70 to the fixed inductor 66 in parallel to generate current flow of the switchable inductor 70 in a same direction of current flow of the fixed inductor 66 as shown in FIG. 4A and discussed herein. In yet some other cases, the switching circuit 68 may couple (e.g., connect) the switchable inductor 70 to the fixed inductor 66 in parallel to generate the current flow of the switchable inductor 70 in an opposite direction of current flow of the fixed inductor 66, as shown in FIG. 4B and discussed below.

The first terminal 126 of the fixed inductor 66 may be coupled to the first capacitor 100, the first shunt capacitor 102, the first switch 134, and the second switch at the second node 120. The first terminal 126 of the fixed inductor 66 may couple to (e.g., connect to) the first terminal 130 of the switchable inductor 70 via the first switch 134. The first terminal 126 of the fixed inductor 66 may couple to (e.g., connect to) the second terminal 132 of the switchable inductor 70 via the second switch 136. The second terminal 128 of the fixed inductor 66 may be coupled to the second capacitor 110, the second shunt capacitor 112, the third switch 138, and the fourth switch 140 at the fourth node 124. The second terminal 128 of the fixed inductor 66 may couple to (e.g., connect to) the first terminal 130 of the switchable inductor 70 via the third switch 138. The second terminal 128 of the fixed inductor 66 may couple to (e.g., connect to) the second terminal 132 of the switchable inductor 70 via the fourth switch 140. The processor 12 of the electronic device 10 or any other viable circuit may provide control signals to open and close the first switch 134, the second switch 136, the third switch 138, and/or the fourth switch 140.

In operation, the fixed inductor 66 may inductively couple to the secondary inductor 72 when the switching circuit 68 uncouples the switchable inductor 70 from the fixed inductor 66. The first switch 134, the second switch 136, the third switch 138, and the fourth switch 140 may open to uncouple the switchable inductor 70 from the fixed inductor 66. For example, the fixed inductor 66 may generate a magnetic field based on receiving the analog signals 90 to induce the amplified signals 92 in the secondary inductor 72. As discussed above, the power amplifier 58 may output the amplified signals 92 in the first bandwidth having the first center frequency when the switchable inductor 70 is uncoupled from the fixed inductor 66.

Moreover, the fixed inductor 66 and the switchable inductor 70 may inductively couple to the secondary inductor 72 when the switchable inductor 70 is coupled to the fixed inductor 66. In the depicted embodiment, the switching circuit 68 couples the switchable inductor 70 to the fixed inductor 66 to generate current flow of the switchable inductor 70 in a same direction of current flow of the fixed inductor 66. In particular, the first switch 134 may close to couple the first terminal 130 of the switchable inductor 70 to the first terminal 126 of the fixed inductor 66 and the fourth switch may close to couple the second terminal 132 of the switchable inductor 70 to the second terminal 128 of the fixed inductor 66. The second switch 136 and the third switch 138 may open or remain open.

The fixed inductor 66 may generate a first magnetic field 142 based on receiving a portion (e.g., a quarter, two third, half, and so on) of the analog signals 90 to induce the amplified signals 92 in the secondary inductor 72. The switchable inductor 70 may generate a second magnetic field 144 based on receiving a portion (e.g., a quarter, two third, half, and so on) of the analog signals 90 in the same direction of current flow of the fixed inductor 66. Moreover, the first magnetic field 142 and the second magnetic field 144 may propagate in the same direction (e.g., approximately the same direction). As such, the first magnetic field 142 and the second magnetic field 144 may combine constructively to generate (e.g., induce) the amplified signals 92 at the secondary inductor 72. In some cases, a first self-inductance 146 of the fixed inductor 66 and a second self-inductance 148 of the switchable inductor 70 may also propagate in the same direction and constructively combine. Accordingly, the fixed inductor 66 and the switchable inductor 70 may exhibit positive coupling based on the switchable inductor 70 and the fixed inductor 66 receiving the analog signals 90 in the same direction (e.g., same current flow direction). Constructively combining the first magnetic field 142 and the second magnetic field 144 may induce the amplified signals 92 in the secondary inductor 72 with a higher voltage compared to a voltage induced by either of the first magnetic field 142 and the second magnetic field 144 in the secondary inductor 72.

In any case, the power amplifier 58 may output the amplified signals 92 in the second bandwidth having the second center frequency when the switchable inductor 70 is coupled to the fixed inductor 66 to generate current flow of the switchable inductor 70 in the same current flow direction. Moreover, coupling the switchable inductor 70 in parallel to the fixed inductor 66 may reduce an impedance of the programmable primary inductor 64 and shift a center frequency of the impedance matching circuit 62 for generating the amplified signals 92 higher. As such, the second center frequency may be higher than the first center frequency. Accordingly, the second bandwidth may have a second high (e.g., maximum) frequency threshold higher than the first high (e.g., maximum) frequency threshold and a second low (e.g., minimum) frequency threshold higher than the first low (e.g., minimum) frequency threshold.

FIG. 4B is a circuit diagram of the power amplifier 58 having the switchable inductor 70 coupled to the fixed inductor 66 in parallel to generate current flow of the switchable inductor 70 in an opposite direction (e.g., opposite current flow direction) of the fixed inductor 66, according to embodiments of the present disclosure. In operation, the fixed inductor 66 and the switchable inductor 70 may inductively couple to the secondary inductor 72 to generate the amplified signals 92. Moreover, the switchable inductor 70 and the fixed inductor 66 may exhibit negative coupling when the switchable inductor 70 is coupled in parallel to the fixed inductor 66 to generate current flow of the switchable inductor 70 in the opposite direction.

In the depicted embodiment, the switching circuit 68 couples the switchable inductor 70 to the fixed inductor 66 to generate current flow of the switchable inductor 70 in the opposite direction of the fixed inductor 66. In particular, the second switch 136 may close to couple the second terminal 132 of the switchable inductor 70 to the first terminal 126 of the fixed inductor 66 and the third switch may close to couple the first terminal 130 of the switchable inductor 70 to the second terminal 128 of the fixed inductor 66. The first switch 134 and the fourth switch 140 may open or remain open.

The fixed inductor 66 may generate the first magnetic field 142 based on receiving a portion (e.g., a quarter, two third, half, and so on) of the analog signals 90 to induce the amplified signals 92 in the secondary inductor 72. The switchable inductor 70 may generate a third magnetic field 150 based on receiving a portion (e.g., a quarter, two third, half, and so on) of the analog signals 90 in the opposite current flow direction of the fixed inductor 66. Moreover, the first magnetic field 142 and the third magnetic field 150 may propagate in an opposite direction (e.g., approximately opposite direction). As such, the first magnetic field 142 and the third magnetic field 150 may combine destructively. Furthermore, the first self-inductance 146 of the fixed inductor 66 and a third self-inductance 152 of the switchable inductor 70 may also propagate in the opposite direction and destructively combine. Accordingly, the fixed inductor 66 and the switchable inductor 70 may exhibit negative coupling based on the switchable inductor 70 and the fixed inductor 66 receiving the analog signals 90 with the opposite current flow direction. Destructively combining the first magnetic field 142 and the second magnetic field 144 may induce the amplified signals 92 in the secondary inductor 72 with a lower voltage compared to a voltage induced by either of the first magnetic field 142 and the second magnetic field 144 in the secondary inductor 72.

In any case, the power amplifier 58 may output the amplified signals 92 in the third bandwidth having the third center frequency when the switchable inductor 70 is coupled to the fixed inductor 66 to generate current flow of the switchable inductor 70 in the opposite direction (e.g., the opposite current flow direction). As mentioned above, coupling the switchable inductor 70 in parallel to the fixed inductor 66 may reduce an impedance of the programmable primary inductor 64 and shift a center frequency of the impedance matching circuit 62 for generating the amplified signals 92 higher. Moreover, negatively coupling the switchable inductor 70 and the fixed inductor 66 may shift the third center frequency of the third bandwidth higher than the second center frequency of the second bandwidth. Accordingly, the third bandwidth may have a third high (e.g., maximum) frequency threshold higher than the second high (e.g., maximum) frequency threshold and a third low (e.g., minimum) frequency threshold higher than the second low (e.g., minimum) frequency threshold.

It should be appreciated that in alternative or additional embodiments, the power amplifier 58 may include additional and/or reduced components. For example, although the illustrated power amplifier 58 includes differential input terminals 106 and 106, in alternative or additional embodiments, the power amplifier 58 may have a single-ended input receiving the outgoing data 56. In such embodiments, the single-ended power amplifier 58 may include the first resistor 98, the first capacitor 100, and the first shunt capacitor 102. For example, the switching circuit 68 of the single-ended power amplifier 58 may include the first switch 134 and the second switch 136. The switching circuit 68 may not include the second switch 136 and the fourth switch 140 or the second switch 136 and the fourth switch 140 may be open.

In some cases, the single-ended power amplifier 58 may include the first terminal 126 of the fixed inductor 66 coupled to the first resistor 98, the first capacitor 100, and the first shunt capacitor 102 when the first switch 134 and the third switch 138 are opened. Moreover, the single-ended power amplifier 58 may include the first terminal 126 of the fixed inductor 66 coupled to the first resistor 98, the first capacitor 100, the first shunt capacitor 102, and the first terminal 130 of the switchable inductor 70 via the first switch 134 when the first switch 134 is closed and the third switch 138 is opened. In such cases, the second terminals of the fixed inductor 66 and the switchable inductor 70 may be coupled to a ground connection. Furthermore, the single-ended power amplifier 58 may include the first terminal 126 of the fixed inductor 66 coupled to the first resistor 98, the first capacitor 100, the first shunt capacitor 102, and the second terminal 132 of the switchable inductor 70 via the third switch 138 when the third switch 138 is closed and the first switch 134 is opened. In such cases, the second terminal 128 of the fixed inductor 66 and the first terminal 130 of the switchable inductor 70 may be coupled to a ground connection.

Figure 5B:
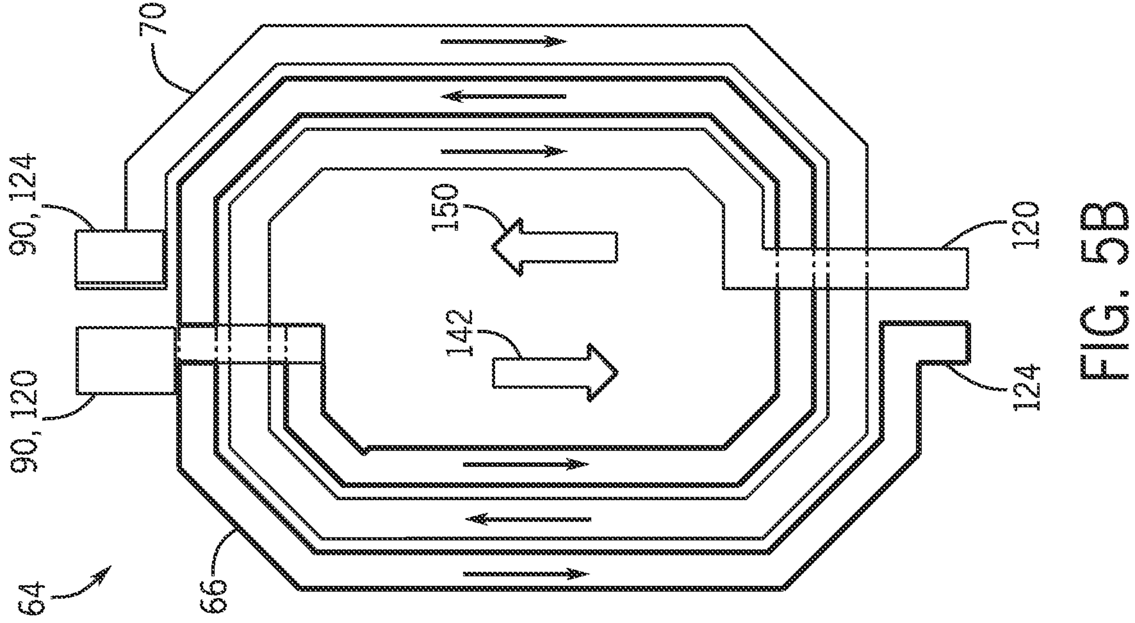
FIG. 5B is the layout of the power amplifier of the transmitter of FIGS. 3 and 4 having the switchable inductor coupled to the fixed inductor to generate a current flow in the opposite direction of current flow through the fixed inductor, according to embodiments of the present disclosure.
Figure 5A:
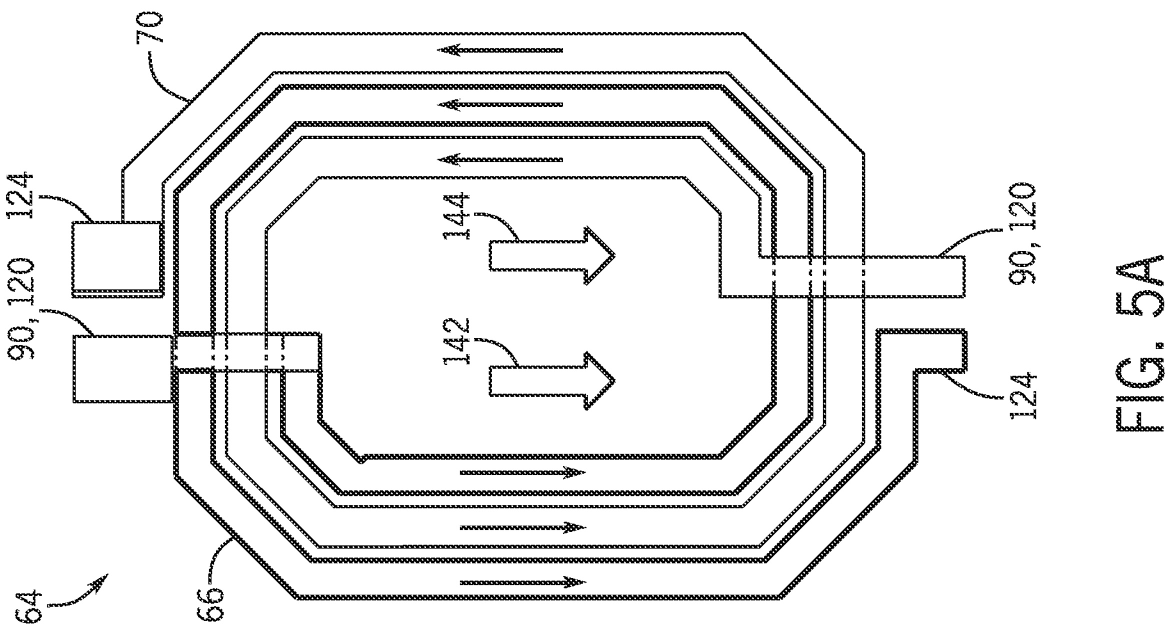
FIG. 5A is a layout of the power amplifier of the transmitter of FIGS. 3 and 4 having the switchable inductor coupled to the fixed inductor to generate a current flow in the direction of current flow through the fixed inductor, according to embodiments of the present disclosure.

FIGS. 5A and 5B are layouts of the fixed inductor 66 and the switchable inductor 70 of the programmable primary inductor 64 discussed above. For example, the power amplifier 58 of the transmitter 52 of FIGS. 3 and 4A discussed above may include the fixed inductor 66 and the switchable inductor 70. In some embodiments, the fixed inductor 66 may be coupled to the first branch 104 and the second branch 114 of the power amplifier 58. In the depicted embodiments, the fixed inductor 66 and the switchable inductor 70 may be interleaved to receive analog signals (e.g., the analog signals 90 discussed above). It should be appreciated that in alternative or additional embodiments, the fixed inductor 66 and the switchable inductor 70 may have different shapes, forms, and/or proximity.

In the depicted embodiment, the fixed inductor 66 and the switchable inductor 70 may be concentric (e.g., approximately concentric) with one another (e.g., share a same center). In alternative or additional embodiments, the fixed inductor 66 and the switchable inductor 70 may be eccentric (e.g., not share a same center). For example, the fixed inductor 66 and the switchable inductor 70 may be interwoven or intertwined with one another. In some embodiments, at least a portion of the fixed inductor 66 and the switchable inductor 70 may overlap. In different embodiments, different portions of the fixed inductor 66 and the switchable inductor 70 may be disposed on a same circuit layer or different circuit layers, for example, of a printed circuit board.

In FIG. 5A, the switchable inductor 70 is coupled to the fixed inductor 66 in a direction of current flow of the fixed inductor 66, according to some embodiments of the present disclosure. For example, the first terminal 130 of the switchable inductor 70 is coupled the first terminal 126 of the fixed inductor 66 and the second terminal 132 of the switchable inductor 70 is coupled to the second terminal 128 of the fixed inductor 66. In operation, the fixed inductor 66 may generate the first magnetic field 142 based on receiving a portion (e.g., a quarter, two third, half, and so on) of an analog signal (e.g., the analog signals 90 discussed above) to induce the amplified signals 92 in the secondary inductor 72 (not shown for simplicity). Moreover, the switchable inductor 70 may generate the second magnetic field 144 based on receiving a portion (e.g., a quarter, two third, half, and so on) of the analog signals in the direction of current flow through the fixed inductor 66. The first magnetic field 142 and the second magnetic field 144 may propagate in the same direction (e.g., approximately the same direction). As such, the first magnetic field 142 and the second magnetic field 144 may combine constructively when generating (e.g., induce) the amplified signals 92 at the secondary inductor 72.

In FIG. 5B, the switchable inductor 70 is coupled to the fixed inductor 66 in an opposite direction of current flow of the fixed inductor 66, according to some embodiments of the present disclosure. For example, the first terminal 130 of the switchable inductor 70 is coupled the second terminal 128 of the fixed inductor 66 and the second terminal 132 of the switchable inductor 70 is coupled to the first terminal 126 of the fixed inductor 66. In operation, the fixed inductor 66 may generate the first magnetic field 142 based on receiving a portion (e.g., a quarter, two third, half, and so on) of an analog signal (e.g., the analog signals 90 discussed above) to induce the amplified signals 92 in the secondary inductor 72 (not shown for simplicity). Moreover, the switchable inductor 70 may generate the third magnetic field 150 based on receiving a portion (e.g., a quarter, two third, half, and so on) of the analog signals in the opposite direction of current flow through the fixed inductor 66. The first magnetic field 142 and the third magnetic field 150 may propagate in the opposite direction (e.g., approximately opposite direction). As such, the first magnetic field 142 and the third magnetic field 150 may combine destructively when generating (e.g., induce) the amplified signals 92 at the secondary inductor 72.

Figure 6:
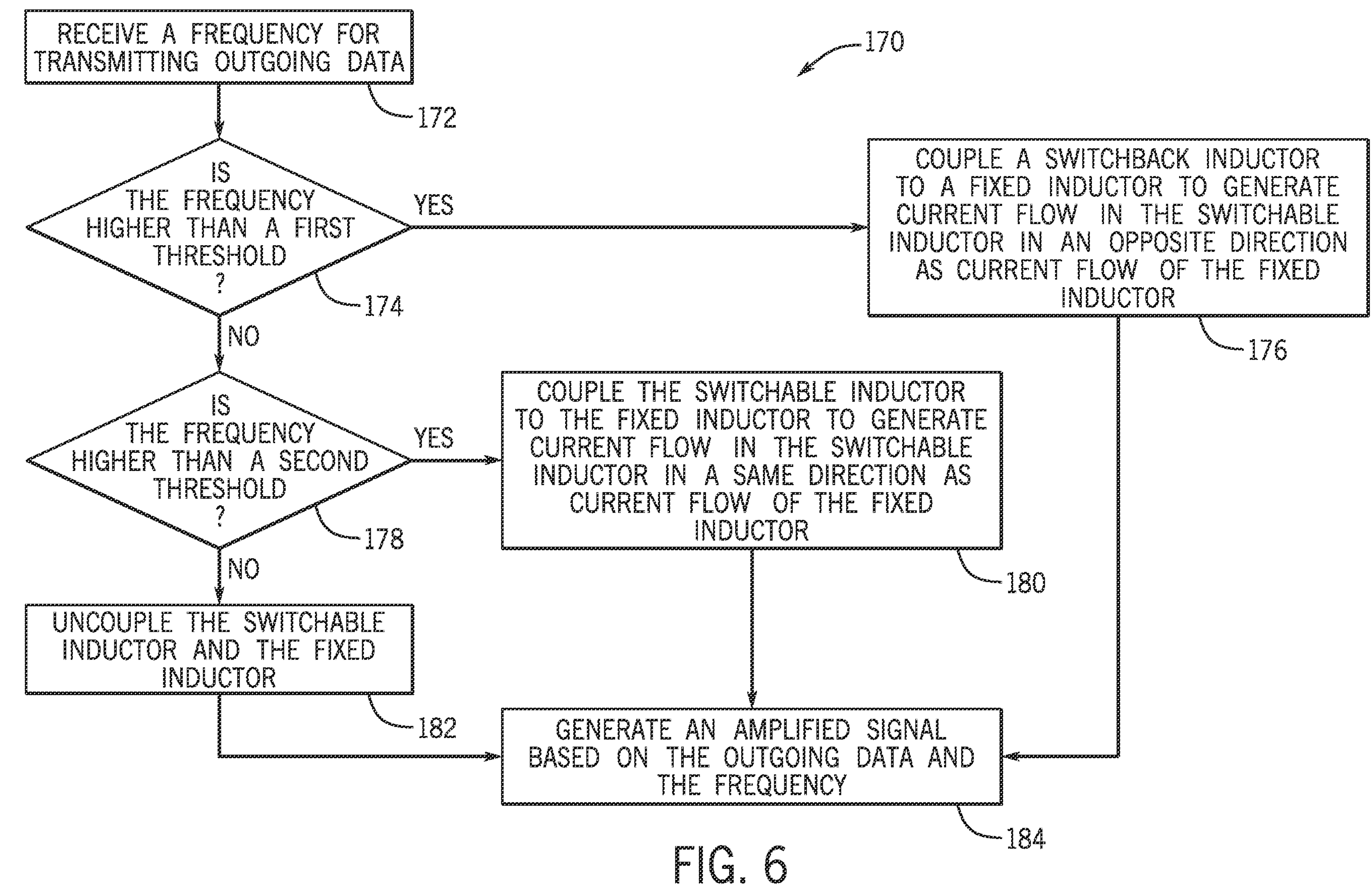
FIG. 6 is a flowchart of a process for generating the amplified signal of the power amplifier of FIGS. 3 and 4 based on a desired center frequency of the amplified signals, according to embodiments of the present disclosure.

FIG. 6 is a flowchart of a method 170 for generating the amplified signals 92 described with respect to the power amplifier 58 with different frequencies by adjusting the programmable primary inductor 64 of the impedance matching circuit 62 illustrated in FIGS. 3 and 4. Any suitable device that may control components of the electronic device 10, such as the processor 12, may perform the method 170. For example, the processor 12 may perform the method 170 by providing control signals to the switches 134, 136, 138, and 140. In some embodiments, the method 170 may be implemented by executing instructions stored in a tangible, non-transitory, computer-readable medium, such as the memory 14 or nonvolatile storage 16, using the processor 12. For example, the method 170 may be performed at least in part by one or more software components, such as an operating system of the electronic device 10, one or more software applications of the electronic device 10, and the like. While the method 170 is described using steps in a specific sequence, it should be understood that the present disclosure contemplates that the described steps may be performed in different sequences than the sequence illustrated, and certain described steps may be skipped or not performed altogether.

At block 172, the processor 12 may receive an indication of a frequency (e.g., a resonant or center frequency) associated with the outgoing data 56. In some embodiments, the processor 12 may receive a desired bandwidth for communication, and the processor 12 may determine the resonant or center frequency of the desired bandwidth. At block 174, the processor 12 may determine whether the frequency is higher than a first threshold. The first threshold may correspond to a high threshold (e.g., maximum) of a bandwidth of the impedance matching circuit 62 when the switchable inductor 70 is coupled to the fixed inductor 66 to generate a first current in the switchable inductor 70 in the same direction as a second current of the fixed inductor 66.

At block 176, the processor 12 may couple the switchable inductor 70 in parallel to the fixed inductor 66 to generate the first current in the switchable inductor 70 in an opposite direction as the second current of the fixed inductor 66, based on or in response to determining that the frequency is higher than the first threshold. For example, the processor 12 may generate control signals to connect the first terminal 126 of the fixed inductor 66 to the second terminal 132 of the switchable inductor 70 and connect the second terminal 128 of the fixed inductor 66 to the first terminal 130 of the switchable inductor 70. As such, the center frequency may be shifted higher than when the switchable inductor 70 is coupled to the fixed inductor 66 to generate the first current in the switchable inductor 70 in the same direction as the second current of the fixed inductor 66.

At block 178, the processor 12 may determine whether the frequency is higher than a second threshold. The second threshold may correspond to a high threshold (e.g., maximum) of a bandwidth of the impedance matching circuit 62 when the switchable inductor 70 is coupled to the fixed inductor 66 to generate the first current in the switchable inductor 70 in the same direction as the second current of the fixed inductor 66.

At block 180, the processor 12 may couple the switchable inductor 70 to the fixed inductor 66 to generate the first current in the switchable inductor 70 in the same direction as the second current of the fixed inductor 66. For example, the processor 12 may generate control signals to connect the first terminal 126 of the fixed inductor 66 to the first terminal 130 of the switchable inductor 70 and connect the second terminal 128 of the fixed inductor 66 to the second terminal 132 of the switchable inductor 70. As such, the center frequency may be shifted lower than when the switchable inductor 70 is coupled to the fixed inductor 66 to generate the first current in the switchable inductor 70 in the opposite direction as the second current of the fixed inductor 66.

At block 182, the processor 12 may uncouple the switchable inductor 70 from the fixed inductor 66 when the frequency is lower than the first threshold and the second threshold. As such, the center frequency may be shifted lower than when the switchable inductor 70 is coupled to the fixed inductor 66. At block 184, the processor 12 may generate (e.g., output) the outgoing data 56 with the frequency to the power amplifier 58 to generate the amplified signals 92 based on the outgoing data 56.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A power amplifier comprising:
a first branch comprising a first capacitor;
a second branch comprising a second capacitor; and
an impedance matching circuit comprising
 a fixed inductor coupled to the first branch and the second branch,
 a switching circuit coupled to the fixed inductor, the switching circuit comprising a plurality of switches,
 a switchable inductor coupled to the switching circuit, and
 a secondary inductor configured to inductively couple to the fixed inductor and the switchable inductor.

2. The power amplifier of claim 1, wherein the switchable inductor is configured to couple to the fixed inductor via the switching circuit.

3. The power amplifier of claim 1, wherein the plurality of switches comprises
 a first switch coupled to a first terminal of the fixed inductor and a first terminal of the switchable inductor,
 a second switch coupled to the first terminal of the fixed inductor and a second terminal of the switchable inductor,
 a third switch coupled to a second terminal of the fixed inductor and the first terminal of the switchable inductor, and
 a fourth switch coupled to the second terminal of the fixed inductor and the second terminal of the switchable inductor.

4. The power amplifier of claim 3, wherein the switching circuit is configured to couple the switchable inductor to the fixed inductor to cause the power amplifier to generate amplified signals having a first bandwidth by closing the first switch and the fourth switch in a first state.

5. The power amplifier of claim 4, wherein the switching circuit is configured to couple the switchable inductor to the fixed inductor to cause the power amplifier to generate amplified signals having a second bandwidth by closing the second switch and the third switch in a second state.

6. The power amplifier of claim 5, wherein the switching circuit is configured to uncouple the switchable inductor from the fixed inductor to cause the power amplifier to generate amplified signals having a third bandwidth by opening the first switch, the second switch, the third switch, and the fourth switch in a third state.

7. The power amplifier of claim 1, comprising a digital-to-analog converter comprising the first branch and the second branch, the digital-to-analog converter configured to receive outgoing data.

8. The power amplifier of claim 1, wherein the first branch comprises a first resistor and a first shunt capacitor, the first resistor being coupled to the first capacitor, the first shunt capacitor being coupled to the first capacitor and the fixed inductor, and the second branch comprises a second resistor and a second shunt capacitor, the second resistor being coupled to the second resistor, and the second shunt capacitor being coupled to the second capacitor and the fixed inductor.

9. A power amplifier comprising:
- a first branch and a second branch configured to generate an analog signal based on receiving outgoing data; and
- an impedance matching circuit configured to generate an amplified signal based on the analog signal comprising
  - a fixed inductor coupled to the first branch and the second branch,
  - a switchable inductor,
  - a switching circuit configured to
    - couple the switchable inductor to the fixed inductor to generate current having a same direction as current of the fixed inductor,
    - couple the switchable inductor to the fixed inductor to generate current having an opposite direction as the current of the fixed inductor, and
    - uncouple the switchable inductor from the fixed inductor, and a secondary inductor configured to output the amplified signal.

10. The power amplifier of claim 9, wherein
- the fixed inductor is configured to inductively couple to the secondary inductor to generate the amplified signal with a first center frequency when the switchable inductor is uncoupled from the fixed inductor,
- the fixed inductor and the switchable inductor are configured to inductively couple to the secondary inductor to generate the amplified signal with a second center frequency higher than the first center frequency when the switchable inductor is coupled to the fixed inductor to generate current having the same direction as the current of the fixed inductor, and
- the fixed inductor and the switchable inductor are configured to inductively couple to the secondary inductor to generate the amplified signal with a third center frequency higher than the second center frequency when the switchable inductor is coupled to the fixed inductor to generate current having the opposite direction as the current of the fixed inductor.

11. The power amplifier of claim 10, wherein the fixed inductor is configured to generate a first magnetic field and the switchable inductor is configured to generate a second magnetic field, the first magnetic field and the second magnetic field constructively combining to generate the amplified signal with the second center frequency based on the switchable inductor being coupled to the fixed inductor to generate current having the same direction as the current of the fixed inductor, and the first magnetic field and the second magnetic field destructively combining to generate the amplified signal with the third center frequency based on the switchable inductor being coupled to the fixed inductor to generate current having an opposite direction as current of the fixed inductor.

12. The power amplifier of claim 9, wherein the switching circuit comprises
- a first switch coupled to a first terminal of the fixed inductor and a first terminal of the switchable inductor,
- a second switch coupled to the first terminal of the fixed inductor and a second terminal of the switchable inductor,
- a third switch coupled to a second terminal of the fixed inductor and the first terminal of the switchable inductor, and
- a fourth switch coupled to the second terminal of the fixed inductor and the second terminal of the switchable inductor.

13. The power amplifier of claim 12, wherein the switching circuit is configured to
- couple the switchable inductor to the fixed inductor to generate current having the same direction as the current of the fixed inductor based on closing the first switch and the fourth switch,
- couple the switchable inductor to the fixed inductor to generate current having the opposite direction as the current of the fixed inductor based on closing the second switch and the third switch, and
- uncouple the switchable inductor from the fixed inductor based on opening the first switch, the second switch, the third switch, and the fourth switch.

14. The power amplifier of claim 9, wherein the switching circuit is configured to
- uncouple the switchable inductor from the fixed inductor based on uncoupling the switchable inductor from the fixed inductor,
- couple the switchable inductor to the fixed inductor to generate current having the same direction as the current of the fixed inductor based on coupling a first terminal of the fixed inductor to a first terminal of the switchable inductor and coupling a second terminal of the fixed inductor to a second terminal of the switchable inductor, and
- couple the switchable inductor to the fixed inductor to generate current the opposite direction as the current of the fixed inductor based on coupling the first terminal of the fixed inductor to the second terminal of the switchable inductor and coupling the second terminal of the fixed inductor to the first terminal of the switchable inductor.

15. The power amplifier of claim 9, wherein the first branch comprises a first resistor configured to receive a first portion of differential outgoing data, a first capacitor coupled to the first resistor, and a first shunt capacitor coupled to the first capacitor, and the second branch comprises a second resistor configured to receive a second portion of differential outgoing data, a second capacitor coupled to the second resistor, and a second shunt capacitor coupled to the second capacitor.

16. A method comprising:
- receiving, by a processor, an indication of a frequency of a signal;
- coupling, by the processor, a switchable inductor of a programmable primary inductor of an impedance matching circuit in parallel to a fixed inductor of the programmable primary inductor to generate a first current in the switchable inductor in an opposite direction as a second current of the fixed inductor in response to determining that the frequency is above a first threshold, wherein a power amplifier comprises the impedance matching circuit;

coupling, by the processor, the switchable inductor to the fixed inductor to generate the first current in the switchable inductor in a same direction as the second current of the fixed inductor in response to determining that the frequency is above a second threshold;

uncoupling, by the processor, the switchable inductor from the fixed inductor; and outputting, by the processor, the signal with the frequency to the power amplifier comprising the impedance matching circuit to generate an amplified signal based on the signal.

17. The method of claim 16, wherein coupling, by the processor, the switchable inductor to the fixed inductor to generate the first current having the opposite direction as the second current is based on coupling, by the processor, a first terminal of the fixed inductor to a second terminal of the switchable inductor and coupling, by the processor, a second terminal of the fixed inductor to a first terminal of the switchable inductor.

18. The method of claim 17, coupling, by the processor, the switchable inductor to the fixed inductor to generate the first current having the same direction as the second current of the fixed inductor is based on coupling, by the processor, the first terminal of the fixed inductor to the first terminal of the switchable inductor and coupling, by the processor, the second terminal of the fixed inductor to thesecond terminal of the switchable inductor.

19. The method of claim 16, wherein the first threshold corresponds to a high threshold of a bandwidth of the impedance matching circuit when the switchable inductor is coupled to the fixed inductor to generate the first current in the same direction as the second current and the second threshold corresponds to the high threshold of the bandwidth of the impedance matching circuit when the switchable inductor is uncoupled from the fixed inductor.

20. The method of claim 16, wherein outputting, by the processor, the signal comprises transmitting, by the processor, the amplified signal by a transmitter of an electronic device comprising the power amplifier.

* * * * *